US010319710B2

(12) United States Patent
Honda et al.

(10) Patent No.: US 10,319,710 B2
(45) Date of Patent: Jun. 11, 2019

(54) SEMICONDUCTOR DEVICE

(71) Applicant: Murata Manufacturing Co., Ltd., Kyoto (JP)

(72) Inventors: Yuri Honda, Nagaokakyo (JP); Fumio Harima, Nagaokakyo (JP); Kazuhito Nakai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/497,663

(22) Filed: Apr. 26, 2017

(65) Prior Publication Data

US 2017/0317066 A1 Nov. 2, 2017

Related U.S. Application Data

(60) Provisional application No. 62/328,223, filed on Apr. 27, 2016.

(51) Int. Cl.
| | |
|---|---|
| *H01L 27/02* | (2006.01) |
| *H01L 23/48* | (2006.01) |
| *H01L 27/082* | (2006.01) |
| *H01L 27/088* | (2006.01) |

(Continued)

(52) U.S. Cl.
CPC ........ *H01L 27/0211* (2013.01); *H01L 23/481* (2013.01); *H01L 27/082* (2013.01); *H01L 27/088* (2013.01); *H03F 3/19* (2013.01); *H03F 3/21* (2013.01); *H03F 2200/408* (2013.01); *H03F 2200/451* (2013.01)

(58) Field of Classification Search
CPC ........................... H01L 27/0211; H01L 23/481
See application file for complete search history.

(56) References Cited

U.S. PATENT DOCUMENTS

| | | | | |
|---|---|---|---|---|
| 2003/0140323 A1* | 7/2003 | Dono | ................... | G06F 17/5068 |
| | | | | 257/365 |
| 2006/0138460 A1* | 6/2006 | Sasaki | ..................... | H01L 23/66 |
| | | | | 257/197 |

(Continued)

FOREIGN PATENT DOCUMENTS

| | | |
|---|---|---|
| JP | 2006-186159 A | 7/2006 |
| JP | 2010-028038 A | 2/2010 |
| JP | 2012-119710 A | 6/2012 |

*Primary Examiner* — Wael M Fahmy
*Assistant Examiner* — Sarah K Salerno
(74) *Attorney, Agent, or Firm* — Pearne & Gordon LLP

(57) ABSTRACT

Provided is a semiconductor device with a reduced variation in temperature among a plurality of unit transistors. A semiconductor device includes: a semiconductor substrate; and a transistor group including at least one column in which a plurality of unit transistors are aligned and arranged along a first axis on the semiconductor substrate. A first column of the at least one column includes: a first group of transistors including two of the unit transistors that are adjacent to each other with a first distance therebetween, and a second group of transistors including two of the unit transistors that are adjacent to each other with a second distance therebetween, the first group of transistors is disposed at a position closer to a center of the first column along the first axis than the second group of transistors, and the first distance is larger than the second distance.

6 Claims, 22 Drawing Sheets

(51) Int. Cl.
*H03F 3/19* (2006.01)
*H03F 3/21* (2006.01)

(56) References Cited

U.S. PATENT DOCUMENTS

2010/0001320 A1* 1/2010 Rohlfing .............. B41J 2/14072
 257/204
2014/0159164 A1* 6/2014 Woo .................... H01L 21/3086
 257/401

* cited by examiner

SEMICONDUCTOR DEVICE

This application claims priority of U.S. Provisional Patent Application No. 62/328,223. The content of this application is incorporated herein by reference in its entirety.

BACKGROUND

Field

The present disclosure relates to semiconductor devices.

Description of Related Art

Mobile communication tools such as mobile phones include a power amplifier circuit to amplify the power of RF (Radio Frequency) signals to be transmitted to a base station. In order to satisfy the high power output level, such a power amplifier circuit has a configuration including a plurality of unit transistors connected in parallel on a substrate (hereinafter called a multi-finger configuration).

SUMMARY

In such a multi-finger configuration, a variation in temperature occurs among the unit transistors because of a difference in the degree of heat dissipation among the places of the substrate on which the unit transistors are arranged. Transistors typically have a temperature characteristic such that current increases with temperature. Therefore if a variation in temperature occurs among a plurality of unit transistors, higher current will flow through a unit transistor at higher temperature than that through other unit transistors. This causes the shortage of output power or deterioration of power efficiency.

In view of the circumstances, the present disclosure aims to provide a semiconductor device with a reduced variation in temperature among a plurality of unit transistors.

A semiconductor device according to one aspect of the present disclosure includes: a semiconductor substrate; and a transistor group including at least one column in which a plurality of unit transistors are aligned and arranged along a first axis on the semiconductor substrate. A first column of the at least one column includes: a first group of transistors including two of the unit transistors that are adjacent to each other with a first distance therebetween, and a second group of transistors including two of the unit transistors that are adjacent to each other with a second distance therebetween, the first group of transistors is disposed at a position closer to a center of the first transistor column along the first axis than the second group of transistors, and the first distance is larger than the second distance.

The present disclosure can provide a semiconductor device with a reduced variation in temperature among a plurality of unit transistors.

DETAILED DESCRIPTION

The following describes embodiments of the present disclosure in details, with reference to the drawings. Like numbers indicate like components throughout the drawings to omit their overlapped descriptions.

Figure 1:
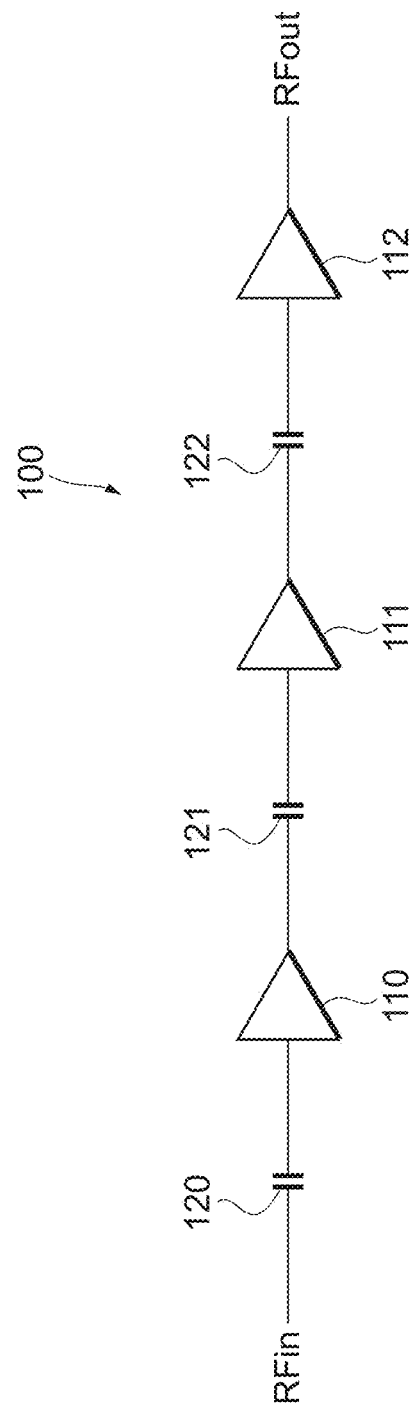
FIG. 1 shows an exemplary configuration of a power amplifier circuit 100, including a semiconductor device according to one embodiment of the present disclosure.

FIG. 1 shows an exemplary configuration of a power amplifier circuit 100, including a semiconductor device according to one embodiment of the present disclosure. The descriptions illustrate an exemplary application, but are not limited to, where a semiconductor device is used in a power amplifier circuit. The power amplifier circuit 100 includes amplifiers 110, 111, 112 and capacitors 120, 121 and 122. Other components (e.g., a bias circuit or a matching circuit) are omitted in the drawing.

The power amplifier circuit 100 includes three-stages of amplifiers including the amplifiers 110, 111, and 112. The power amplifier circuit 100 amplifies an input RF (Radio Frequency) signal RFin with the amplifiers 110, 111, and 112 sequentially and outputs an amplified signal RFout. Although the amplifiers are not especially limited, they may be bipolar transistors such as a heterojunction bipolar transistor (HBT) or other transistors such as a metal-oxide-semiconductor field effect transistor (MOSFET). In the present embodiment, the amplifier 112 at the final stage, for example, has a multi-finger configuration including a plurality of unit transistors connected in parallel.

The capacitors 120 to 122 are configured to remove DC components of the RF signal RFin.

Figure 2:
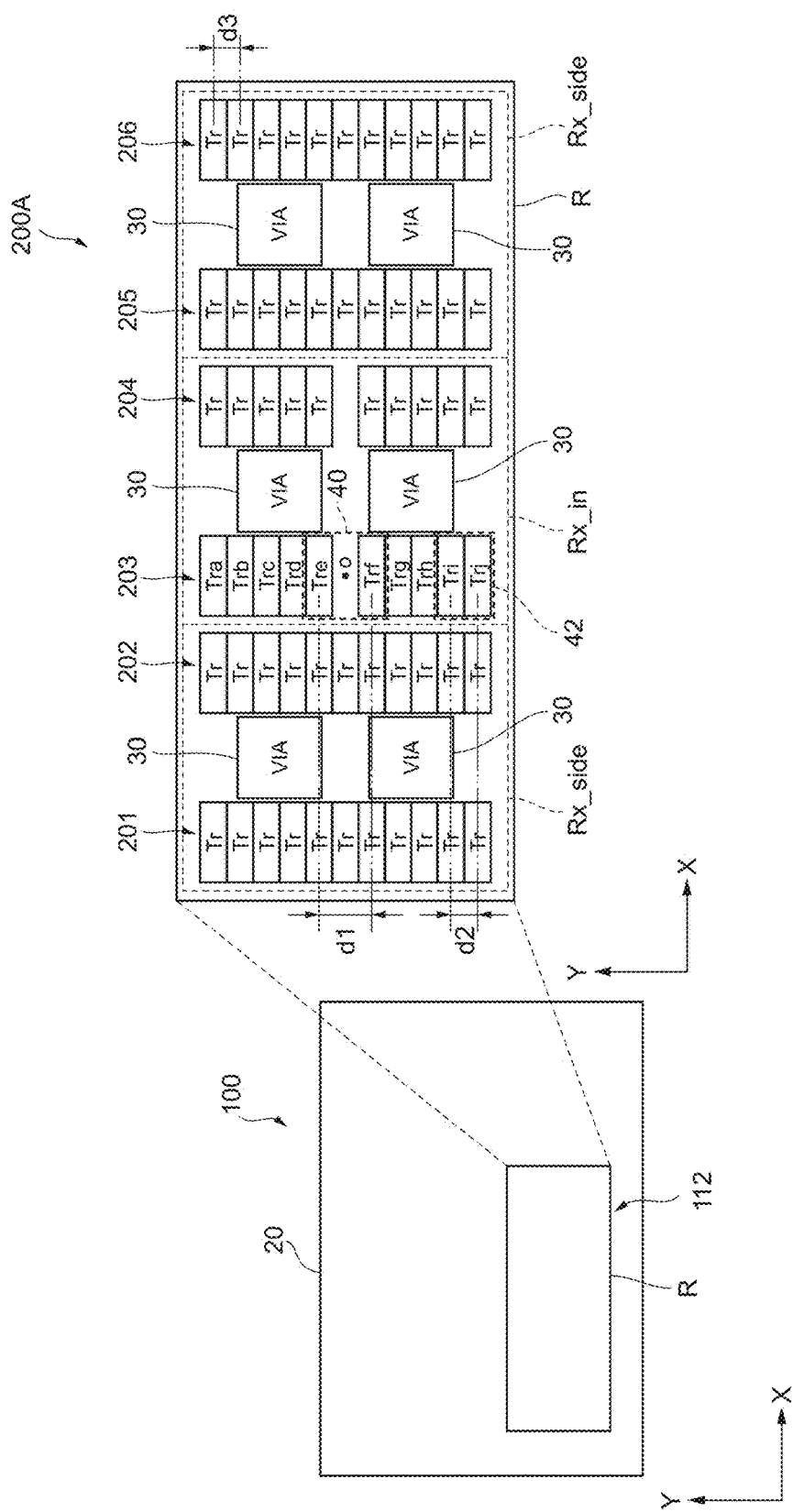
FIG. 2 shows exemplary arrangement 200A of unit transistors in the amplifier 112.

Next referring to FIG. 2, the following describes the arrangement of unit transistors in the amplifier 112 at the final stage.

FIG. 2 shows an exemplary arrangement 200A of unit transistors in the amplifier 112. The power amplifier circuit 100 is formed on a semiconductor substrate 20 having a principal surface parallel to the X-Y plane. At a region R of the semiconductor substrate 20, the amplifier 112 having a multi-finger configuration is formed. In the exemplary arrangement 200A of FIG. 2, the region R has a substantially rectangular shape, in which transistor columns 201 to 206 of six columns in total are arranged side by side along the X-axis direction (second direction). Via holes 30 are formed between the transistor column 201 and the transistor column 202, the transistor column 203 and the transistor column 204, and the transistor column 205 and the transistor column 206. Although the present embodiment illustrates the configuration of six transistor columns, the transistor columns are not limited to six columns and the shape of the region R also is not limited to a rectangular shape. The same applies to other embodiments.

Each of the transistor columns 201 to 206 (a transistor group) includes a plurality of unit transistors that are aligned along the Y-axis direction (first direction) orthogonal to the X-axis direction. Specifically, the transistor columns 201, 202, 205 and 206 that are located at outside regions Rx_side in the X-axis direction of the region R each include eleven unit transistors. The transistor columns 203 and 204 that are located at an inside region Rx_in in the X-axis direction of the region R each include ten unit transistors. The number of unit transistors in the transistor columns 201 to 206 is may vary in other embodiments.

The following describes the arrangement of the transistor columns 203 and 204 (first transistor columns), by way of an example of the transistor column 203. In comparison with the configuration of the transistor columns 201, 202, 205, and 206, the transistor column 203 does not include one unit transistor close to the center O along the Y-axis direction. Specifically the transistor column 203 includes a group of unit transistors 40 (first group of unit transistors) made up of unit transistors Tre and Trf formed at a position close to the center O along the Y-axis direction and a group of unit transistors 42 (second group of unit transistors) made up of unit transistors Tri and Trj formed at a position away from the center O compared with the group of unit transistors 40. The distance d1 denotes the distance between the unit transistors Tre and Trf (first distance) and the distance d2 denotes the distance between the unit transistors Tri and Trj (second distance). The distance d1 is larger than the distance d2 (d1>d2).

Meanwhile, in the transistor column 202 and the transistor column 205 (a group of second transistor columns) and in the transistor column 201 and the transistor column 206 (a group of second transistor columns) located on both sides of the transistor columns 203 and 204 along the X-axis direction, unit transistors are aligned so that the distance d3 (fourth distance) between adjacent unit transistors is constant. The distance d3 is smaller than the distance d1 (d1>d3). Moreover, the distance d3 may be the same as the distance d2, or may be larger or smaller than the distance d2.

Before describing the advantageous effect of the exemplary arrangement 200A, a comparative example is described below. Unlike the exemplary arrangement 200A of FIG. 2, the transistor columns 203 and 204 in the comparative example each include eleven unit transistors similarly to the transistor columns 201 or the like.

Figure 3:
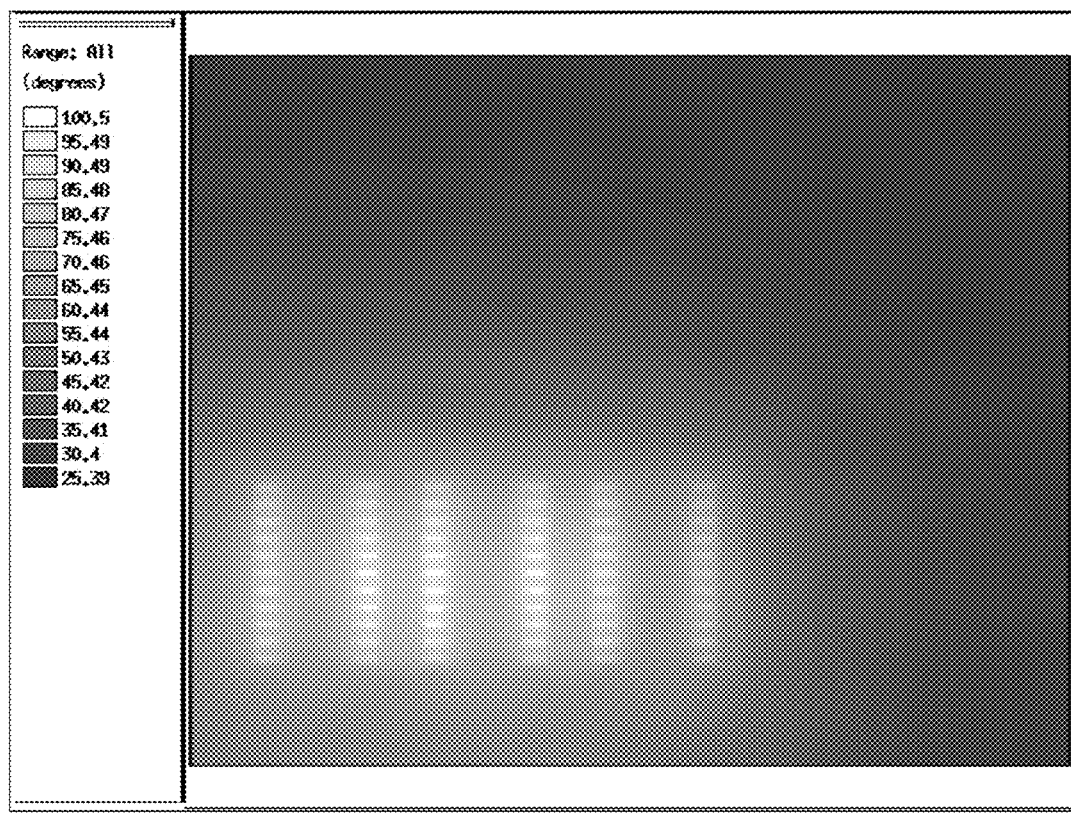
FIG. 3 shows one example simulation result on the temperature distribution of unit transistors in a comparative example.

FIG. 3 shows one example of simulation result on the temperature distribution of unit transistors in the comparative example. The drawing shows the temperature distribution of 66 unit transistors (11 unit transistors×6 columns) formed at a region on a semiconductor substrate. A center portion of the region R in the XY plane has a smaller degree of heat dissipation than that portions closer to the edge of the region R, and therefore the unit transistors at the center portion are at high temperatures. Accordingly, as shown in FIG. 3, there is a temperature variation among the 66 unit transistors.

Figure 4:
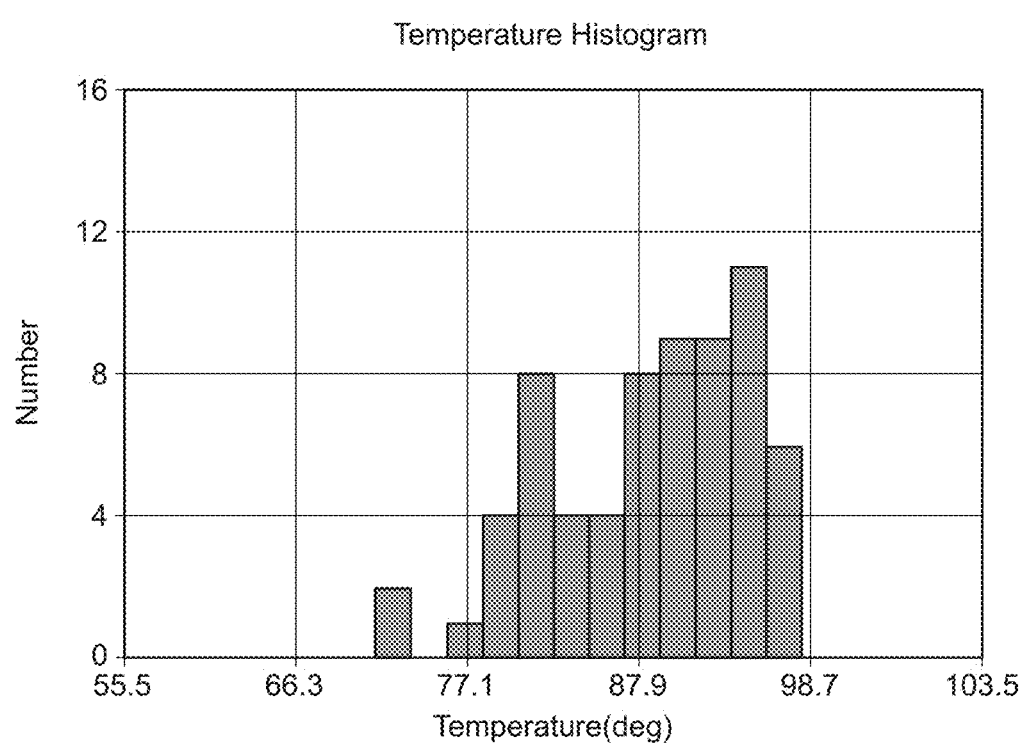
FIG. 4 is a histogram showing one example simulation result on the temperature distribution of the unit transistors in the comparative example.

FIG. 4 is a histogram showing one example simulation result on the temperature distribution of the unit transistors in the comparative example. In the graph of FIG. 4, the vertical axis represents the number of unit transistors and the horizontal axis represents the temperature (deg.) of the unit transistors. In this histogram, concentration of the number of unit transistors on a predetermined temperature means a more homogenized state of the temperatures of the plurality of unit transistors, and dispersion of the number of unit transistors means that the temperature varies more widely.

As shown in FIG. 4, the number of unit transistors in the comparative example shows dispersion in the relatively high-temperature range (e.g., 87.9° C. to 98.7° C.). In this way, when a plurality of unit transistors have a variation in temperature, higher current will flow through a unit transistor at a higher temperature because of the temperature characteristic of transistors, and this causes a shortage of output power or deterioration of power efficiency.

On the contrary, in the exemplary arrangement 200A of FIG. 2, this arrangement does not include a unit transistor close to the center O in the transistor columns 203 and 204 located at the inside region Rx_in of the region R as stated above. This configuration can suppress a temperature rise at a center part that is represented at the highest temperature in FIG. 3. At the outside regions Rx_side (where temperatures are lower than at the inside region Rx_in), the unit transistors are relatively densely formed. Accordingly, a temperature variation among the plurality unit transistors can be lowered.

Figure 5:
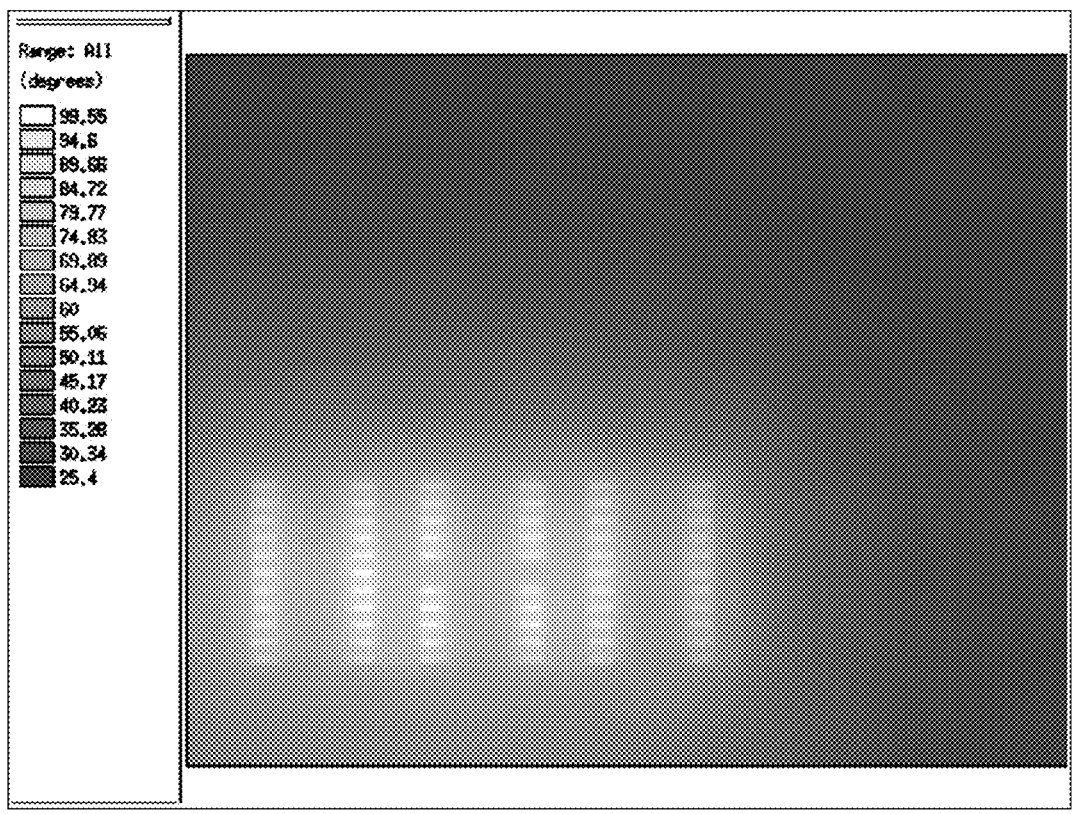
FIG. 5 shows one example simulation result on the temperature distribution of unit transistors in the exemplary arrangement 200A.

FIG. 5 shows one example simulation result on the temperature distribution of unit transistors in the exemplary arrangement 200A. The figure shows the temperature distribution of 64 unit transistors (11 transistors×4 columns+10 transistors×2 columns) formed at a partial region on a semiconductor substrate. In the exemplary arrangement 200A, the distance between the unit transistors located close to the center in the transistor columns 203 and 204 is larger. Therefore a temperature rise at a center part can be suppressed in the temperature distribution of FIG. 5 compared with the temperature distribution of FIG. 3.

Figure 6:
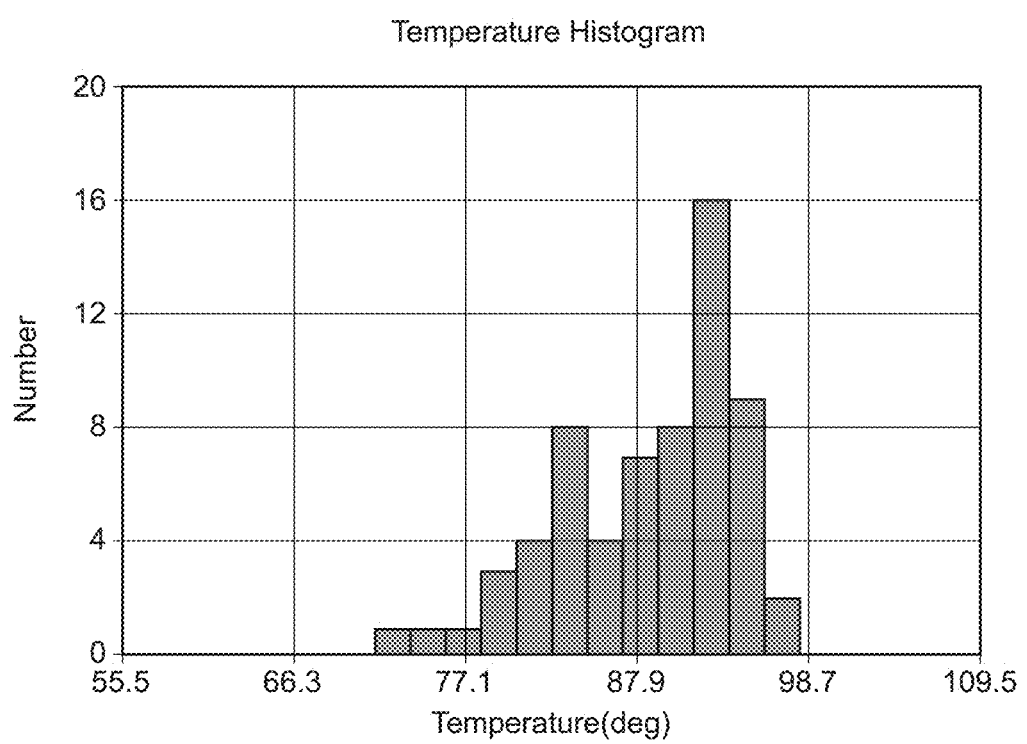
FIG. 6 is a histogram showing one example simulation result on the temperature distribution of the unit transistors in the exemplary arrangement 200A.

FIG. 6 is a histogram showing one example simulation result on the temperature distribution of the unit transistors in the exemplary arrangement 200A. As shown in FIG. 6, the number of the unit transistors at the highest temperature decreases in the exemplary arrangement 200A as compared with the comparative example of FIG. 4, and the number of the unit transistors at 92 degrees increases. That is, it can be said that a temperature variation among the plurality unit transistors (e.g., in the high-temperature range) can be lowered.

Figure 7:
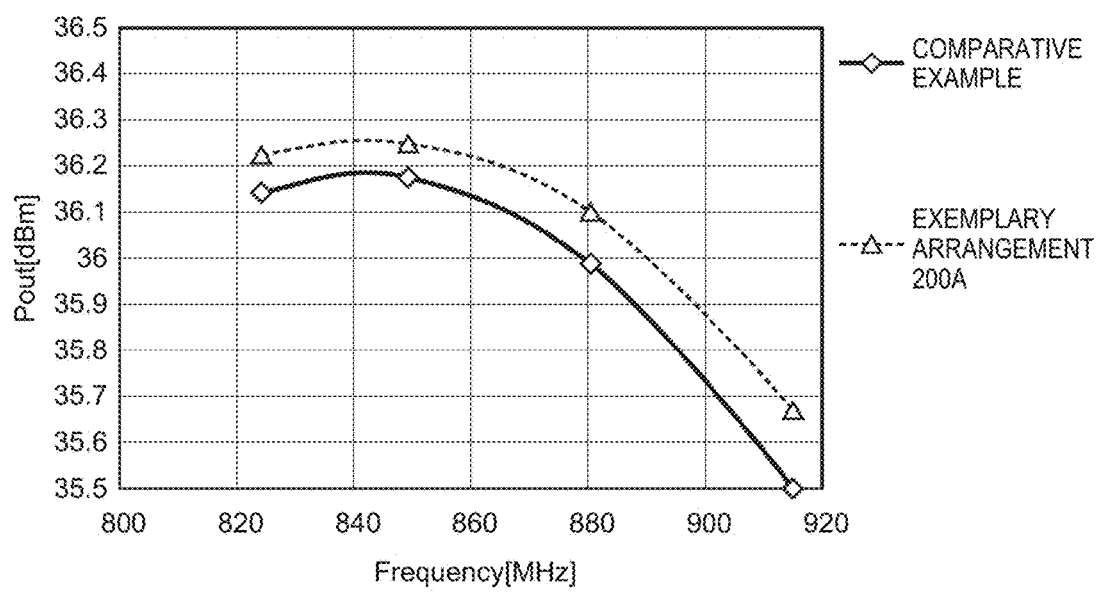
FIG. 7 shows one example simulation result on the output power in the power amplifier circuit 100 according to one embodiment of the present disclosure and in the comparative example.

FIG. 7 shows one example simulation result on the output power in the power amplifier circuit 100 according to one embodiment of the present disclosure and the comparative example. The power amplifier circuit 100 in this case includes the amplifier 112 at the final stage having the configuration of the exemplary arrangement 200A. This simulation result shows the maximum output power while changing the frequency when the input power is 6 dBm. In this graph, the vertical axis represents the output power (dBm) and the horizontal axis represents the frequency (MHz).

As shown in FIG. 7, the exemplary arrangement 200A shows larger maximum output power for every frequency than those in the comparative example. Specifically, although the number of the unit transistors in the exemplary arrangement 200A is less than that of the comparative example by 2, the output power increases by about 0.1 dB.

Figure 8:
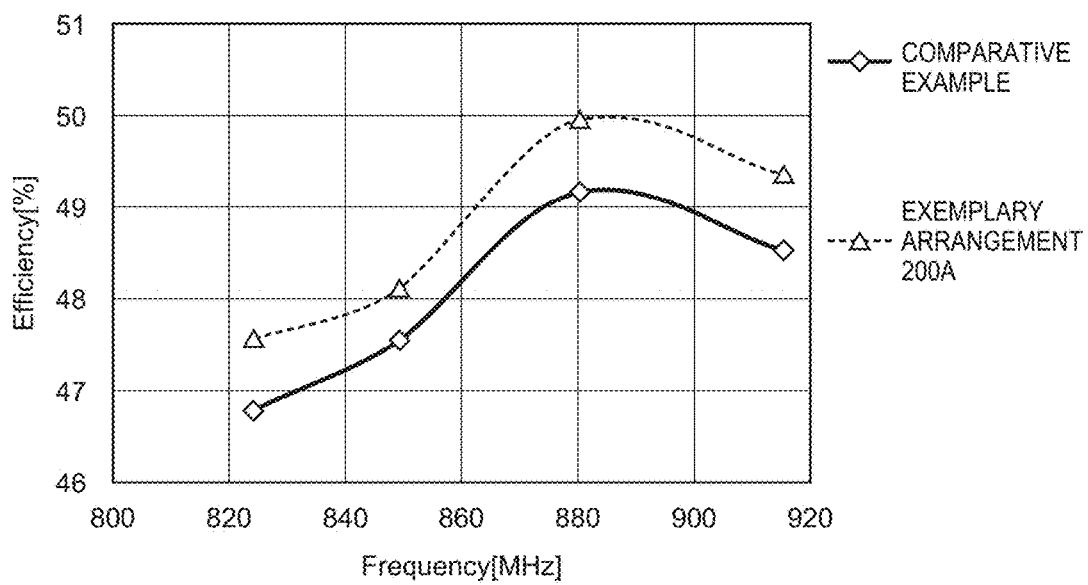
FIG. 8 shows one example simulation result on the power added efficiency in the power amplifier circuit 100 according to one embodiment of the present disclosure and in the comparative example.

FIG. 8 shows one example simulation result on the power added efficiency in the power amplifier circuit 100 according to one embodiment of the present disclosure and the comparative example. This simulation result shows the power added efficiency corresponding to the maximum output power while changing the frequency. In this graph, the vertical axis represents the power added efficiency (%) and the horizontal axis represents the frequency (MHz).

As shown in FIG. 8, the exemplary arrangement 200A shows improved power added efficiency for every frequency by about 0.5 to 1.0% as compared with the comparative example. That is, such a specific arrangement of the unit transistors can suppress a variation in temperature, whereby concentration of current on a part of the unit transistors can be prevented, and the power added efficiency can be improved. In this way, although the number of the unit transistors in the exemplary arrangement 200A is less than that of the comparative example by 2 transistors, the output power can be increased by more uniform operation of the unit transistors.

Although FIG. 1 shows the power amplifier circuit including the amplifiers at three stages, the number of the stages of amplifiers is not limited to three and may be one, two, four or more. When the power amplifier circuit includes amplifiers at two or more stages, the amplifier at the final stage (power stage) has a maximum output power compared with other stages. Therefore, the arrangement of unit transistors according to the present disclosure is preferably used at the amplifier at the final stage.

Figure 9:
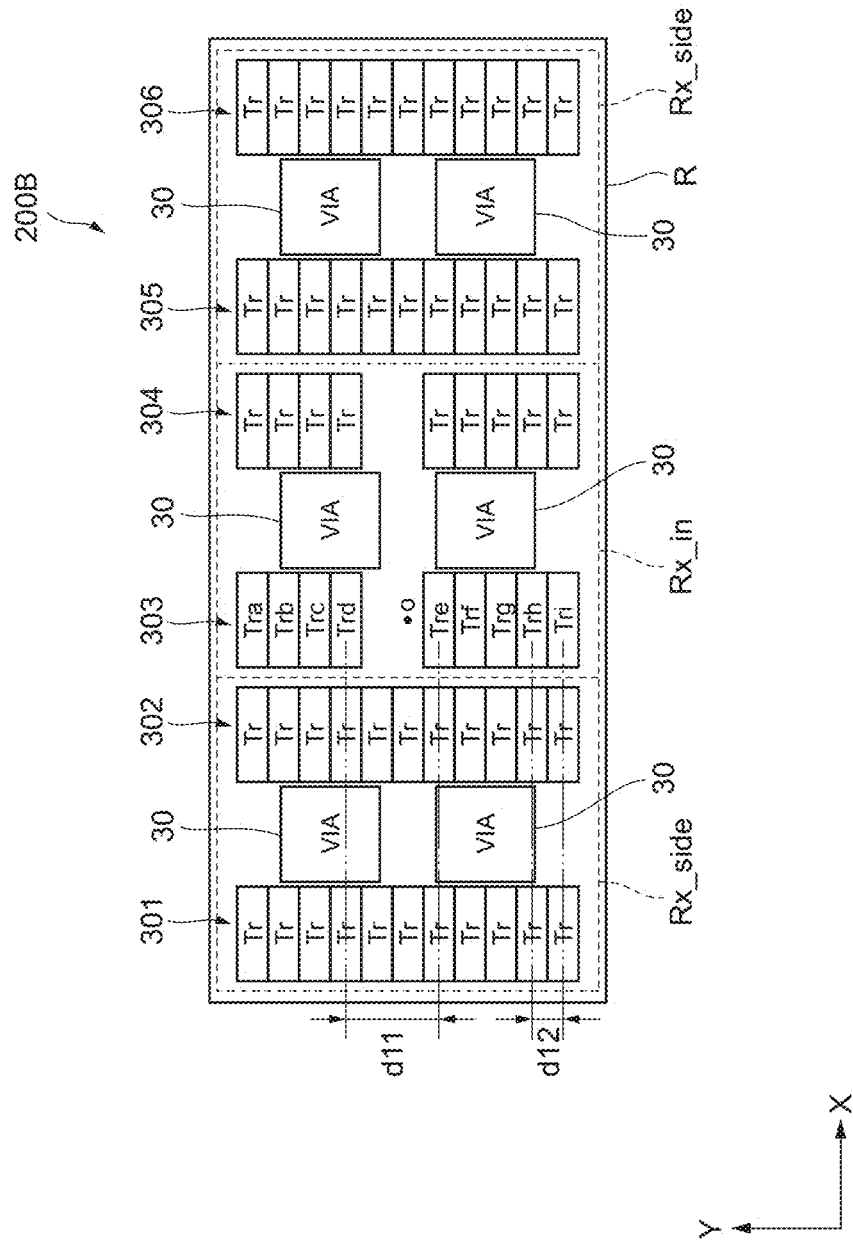
FIG. 9 shows another exemplary arrangement 200B of unit transistors in the amplifier 112.

FIG. 9 shows another exemplary arrangement (exemplary arrangement 200B) of unit transistors in the amplifier 112. Like numbers indicate like components in the exemplary arrangement 200A of FIG. 2 to omit their descriptions. In this embodiment or later, the descriptions common to those for the above embodiment are omitted. For example, advantageous effects similar to those experienced with the above configuration are not mentioned for each of the embodiments.

In the exemplary arrangement 200B of FIG. 9, there are transistor columns 301 to 306. Transistor columns 303 and 304 at the inside region Rx_in do not include two unit transistors located close to the center O in the Y-axis direction. That is, the distance d11 between the unit transistors Trd and Tre (first distance) is larger than the distance d12 between the unit transistors Trh and Tri (second distance) (d11>d12). The distance d11 is larger than the distance d1 in FIG. 2 (d11>d1). The number of unit transistors that are not disposed adjacent to the center in the transistor columns 303 and 304 is not limited to two, and it may be three or more in some examples.

Figure 10:
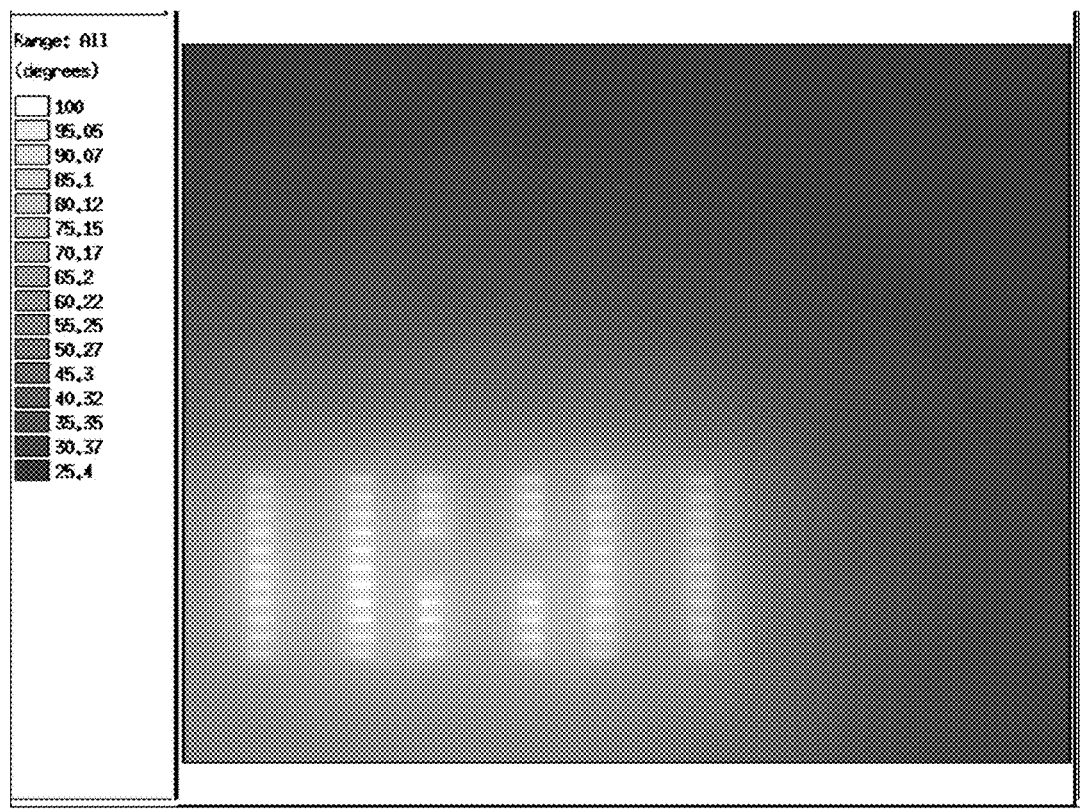
FIG. 10 shows one example simulation result on the temperature distribution of unit transistors in the exemplary arrangement 200B.

FIG. 10 shows one example simulation result on the temperature distribution of unit transistors in the exemplary arrangement 200B. The drawing shows the temperature distribution of 62 unit transistors (11 transistors×4 columns+9 transistors×2 columns) formed at a partial region on a semiconductor substrate. In the exemplary arrangement 200B, the distance between the unit transistors located close to the center O in the transistor columns 303 and 304 is larger. Therefore, a temperature rise at a center part can be suppressed in the temperature distribution of FIG. 10 compared with the temperature distribution of FIG. 3.

Figure 11:
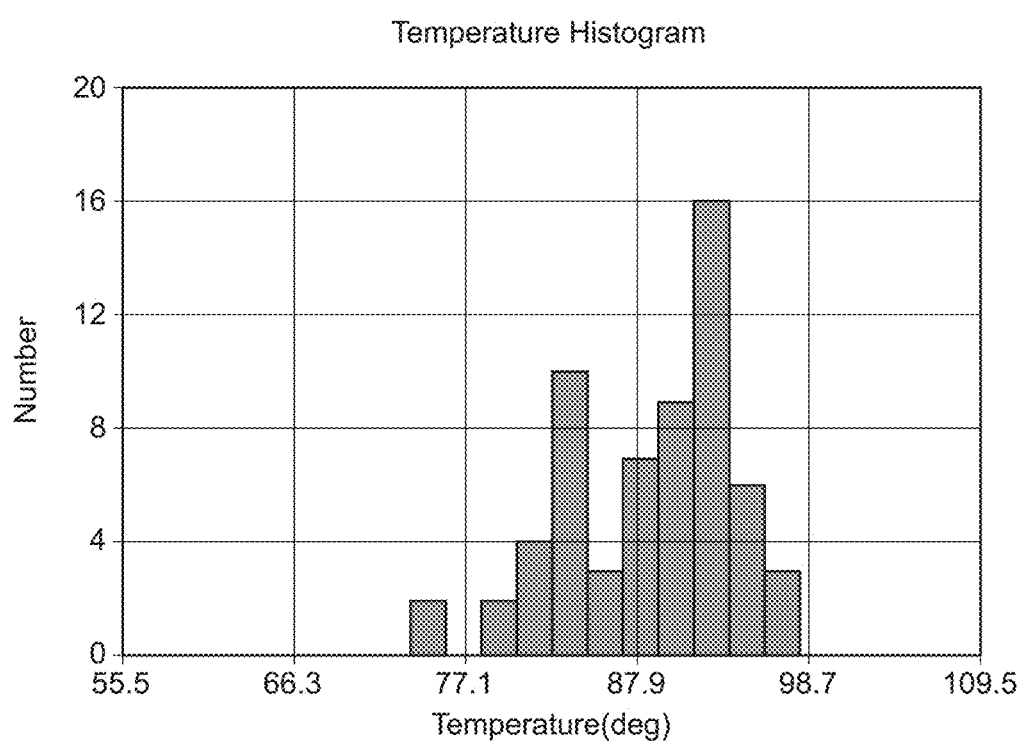
FIG. 11 is a histogram showing one example simulation result on the temperature distribution of the unit transistors in the exemplary arrangement 200B.

FIG. 11 is a histogram showing one example simulation result on the temperature distribution of the unit transistors in the exemplary arrangement 200B. As shown in FIG. 11, similarly to the exemplary arrangement 200A, the number of the unit transistors at 92 degrees increases in the exemplary arrangement 200B. That is, it can be said that a temperature variation among the plurality unit transistors can be lowered.

Figure 12:
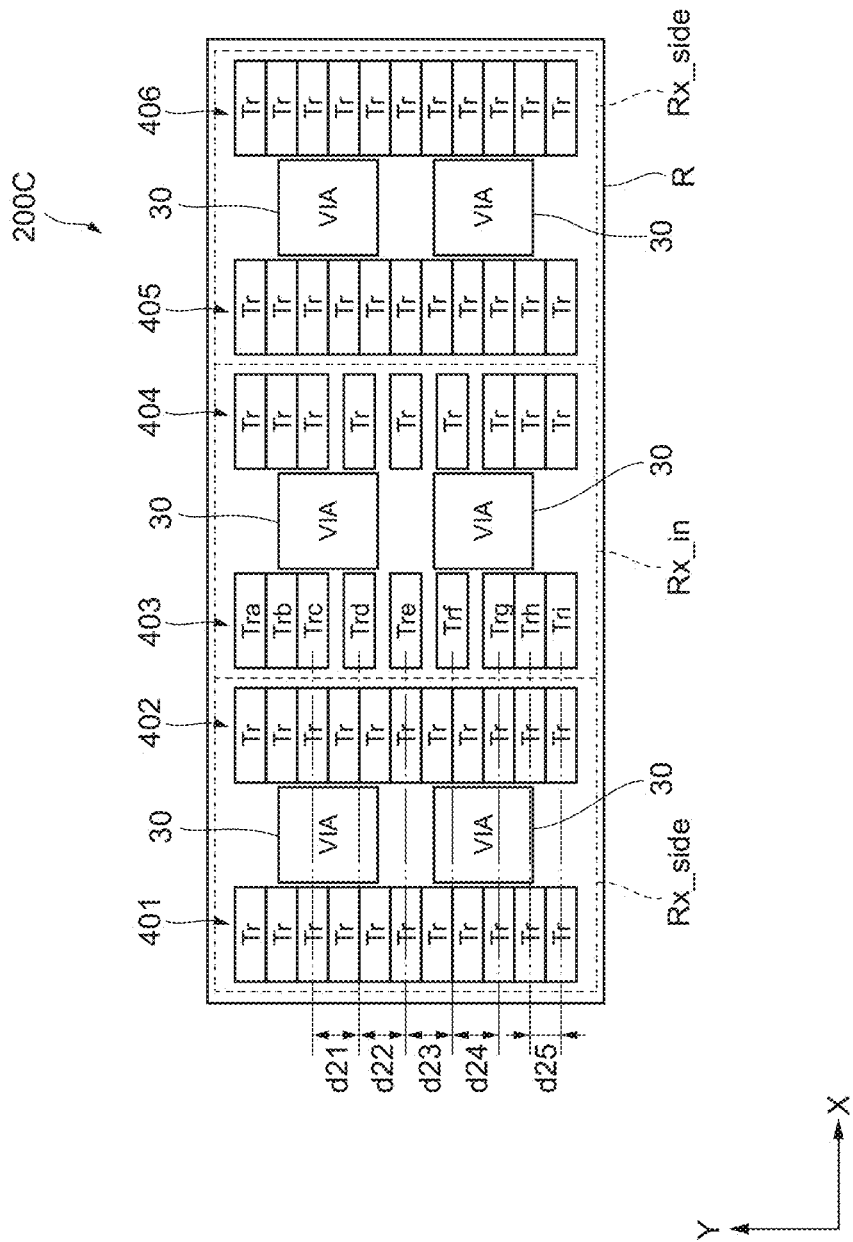
FIG. 12 shows another exemplary arrangement 200C of unit transistors in the amplifier 112.

FIG. 12 shows another exemplary arrangement (exemplary arrangement 200C) of unit transistors in the amplifier 112. Like numbers indicate like components in the exemplary arrangement 200A of FIG. 2 to omit their descriptions.

In exemplary arrangement 200C of FIG. 12, there are transistor columns 401 to 406. In the transistors column 403 and 404 at the inside region Rx_in, unit transistors located close to the center in the Y-axis direction are arranged having a substantially constant distance between them. That is, the distance d21 between the unit transistors Trc and Trd, the distance d22 between the unit transistors Trd and Tre, the distance d23 between the unit transistors Tre and Trf, and the distance d24 between the unit transistors Trf and Trg are larger than the distance d25 between the unit transistors Trh and Tri (d21≈d22≈d23≈d24>d25).

Figure 13:
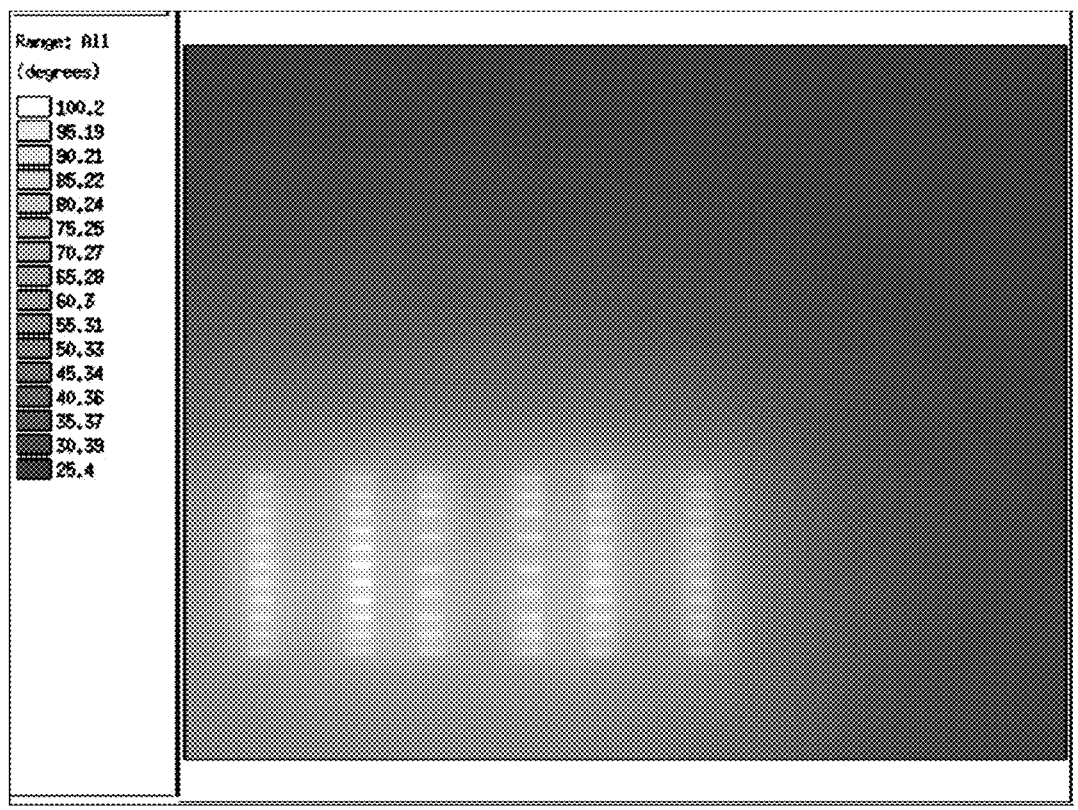
FIG. 13 shows one example simulation result on the temperature distribution of unit transistors in the exemplary arrangement 200C.

FIG. 13 shows one example simulation result on the temperature distribution of unit transistors in the exemplary arrangement 200C. Similarly to the exemplary arrangement 200A, 200B, a temperature rise at a center part can be suppressed in the exemplary arrangement 200C compared with the temperature distribution of FIG. 3.

Figure 14:
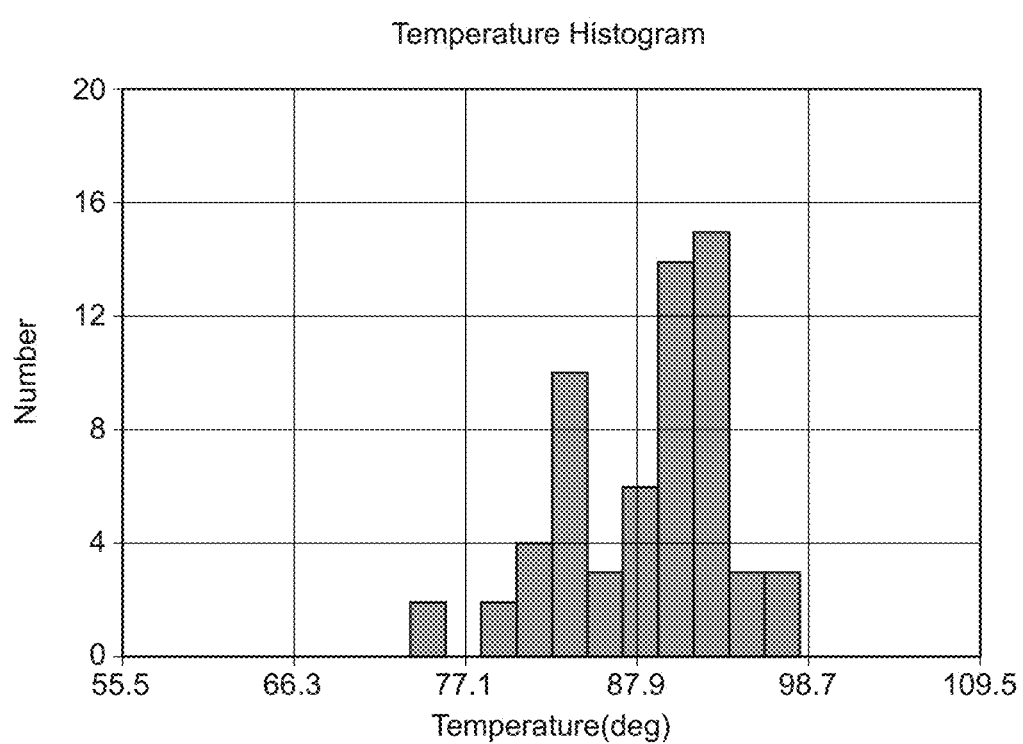
FIG. 14 is a histogram showing one example simulation result on the temperature distribution of the unit transistors in the exemplary arrangement 200C.

FIG. 14 is a histogram showing one example simulation result on the temperature distribution of the unit transistors in the exemplary arrangement 200C. As shown in FIG. 14, the number of the unit transistors at 90 to 92 degrees increases in the exemplary arrangement 200C. That is, it can be said that a temperature variation among the plurality unit transistors can be lowered.

Figure 15:
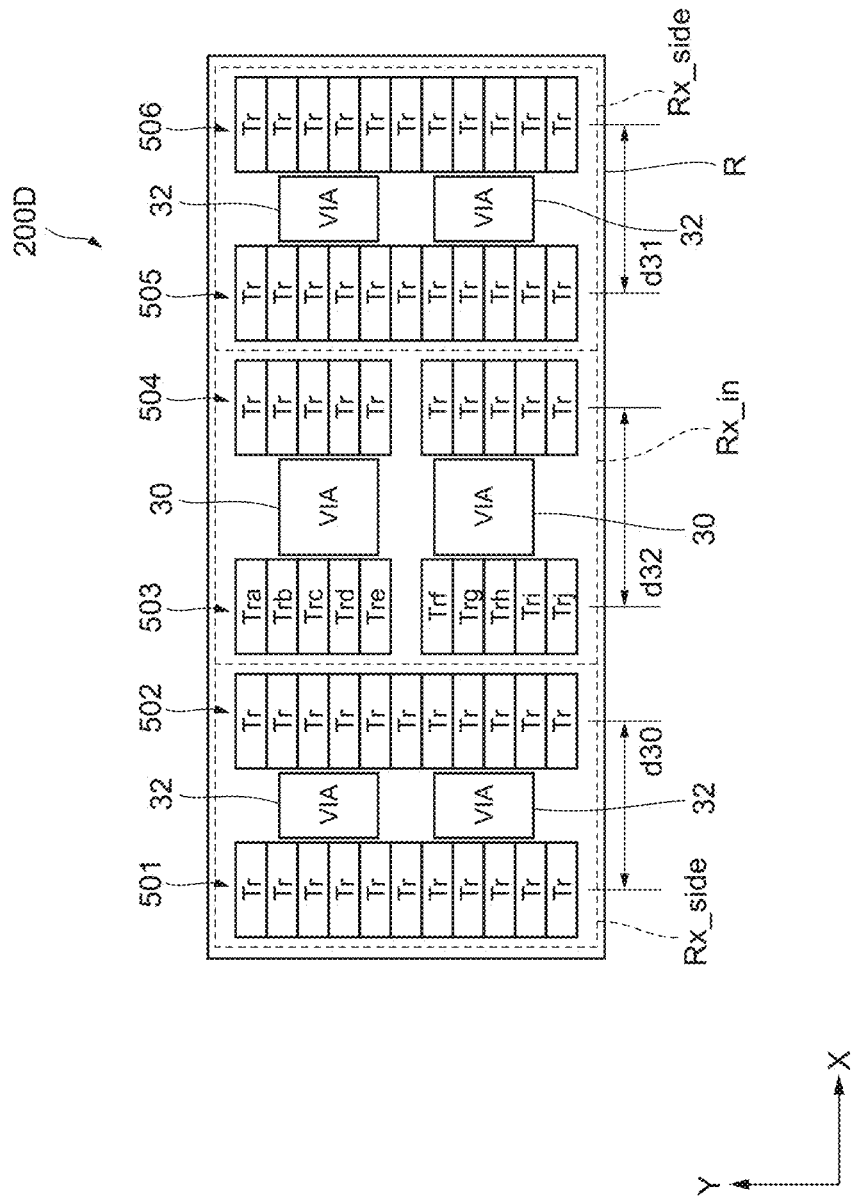
FIG. 15 shows another exemplary arrangement 200D of unit transistors in the amplifier 112.

FIG. 15 shows another exemplary arrangement (exemplary arrangement 200D) of unit transistors in the amplifier 112. Like numbers indicate like components in the exemplary arrangement 200A of FIG. 2 to omit their descriptions.

In comparison with the exemplary arrangement 200A, the total number and the arrangement of transistors in the exemplary arrangement 200D in FIG. 15 are the same, but the distance between the transistor columns in the transistor columns 501 to 506 in the X-axis direction is different. Specifically, the distance d30 between the transistor column 501 and the transistor column 502 and the distance d31 between the transistor column 505 and the transistor column 506 are smaller than their corresponding distances in the exemplary arrangement 200A. That is, the via holes 32 in the exemplary arrangement 200D are smaller than the via holes 30 in the exemplary arrangement 200A. Thereby, the area of the region R of the exemplary arrangement 200D on which unit transistors are to be formed is smaller than that of the exemplary arrangement 200A, whereby the substrate can be made smaller. As shown in FIG. 15, the distance d32 between the transistor column 503 and the transistor column 504 at the inside region Rx_in may be larger than the distances d30 and d31 between the transistor columns at the outside region Rx_side (d30, d31<d32). Thereby, the distances between unit transistors can be larger in the X-axis direction as well as in the Y-axis direction, so that a temperature rise at a center part can be further suppressed.

Figure 16:
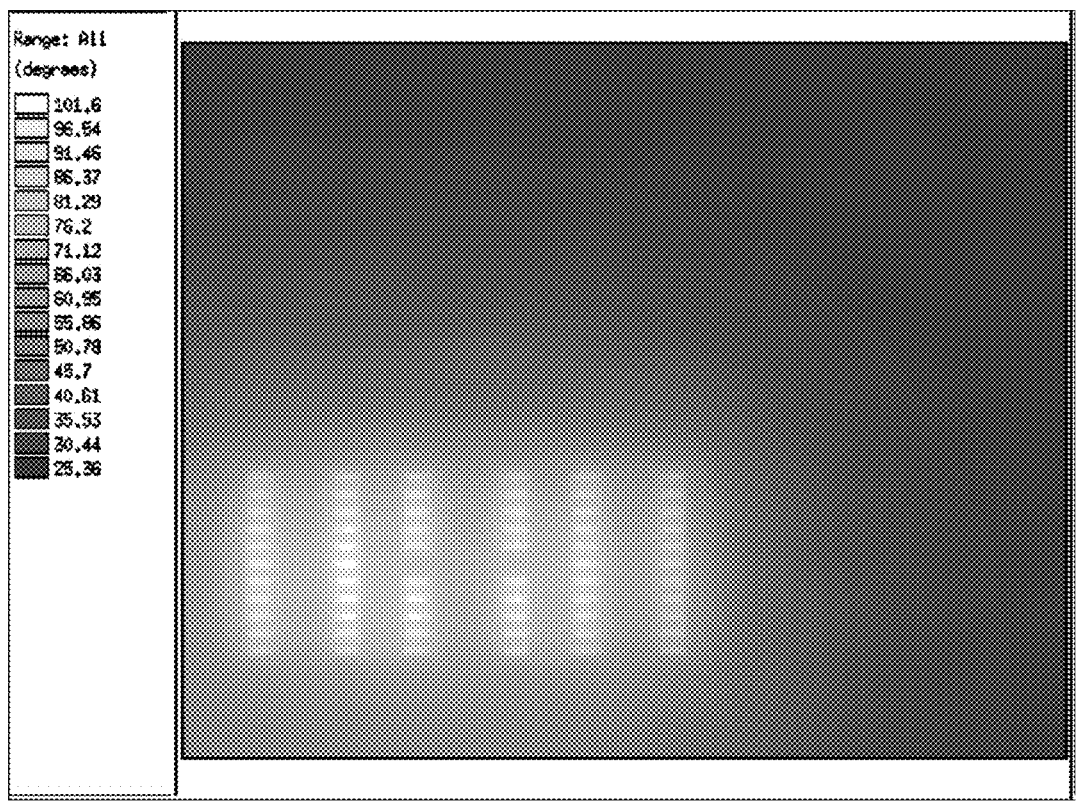
FIG. 16 shows one example simulation result on the temperature distribution of unit transistors in the exemplary arrangement 200D.
Figure 17:
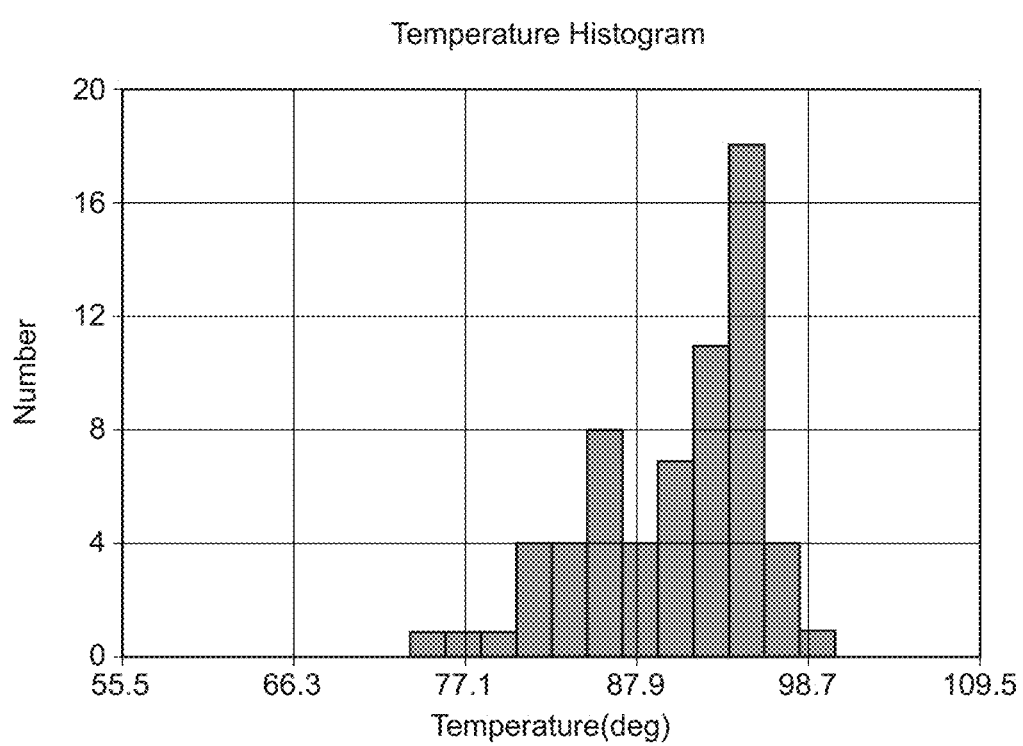
FIG. 17 is a histogram showing one example simulation result on the temperature distribution of the unit transistors in the exemplary arrangement 200D.

FIG. 16 shows one example simulation result on the temperature distribution of unit transistors in the exemplary arrangement 200D. FIG. 17 is a histogram showing one example of simulation result on the temperature distribution of the unit transistors in the exemplary arrangement 200D.

As shown in FIG. 17, the temperature distribution of the transistors in the exemplary arrangement 200D is similar to the temperature distribution in the exemplary arrangement 200A in FIG. 6. In the exemplary arrangement 200D, temperature in the transistor columns 501 and 506 may increase compared with the exemplary arrangement 200A because the distance d30 and the distance d31 are smaller. However, the transistor columns 501 and 506 are located at the outside regions Rx_side in the X-axis direction of the region R, and temperature there is lower than that at the inside region Rx_in. Therefore, even when the temperature at the transistor columns 501 and 506 increases, this does not pose a problem with homogenization of the temperature among all of the unit transistors.

Figure 18:
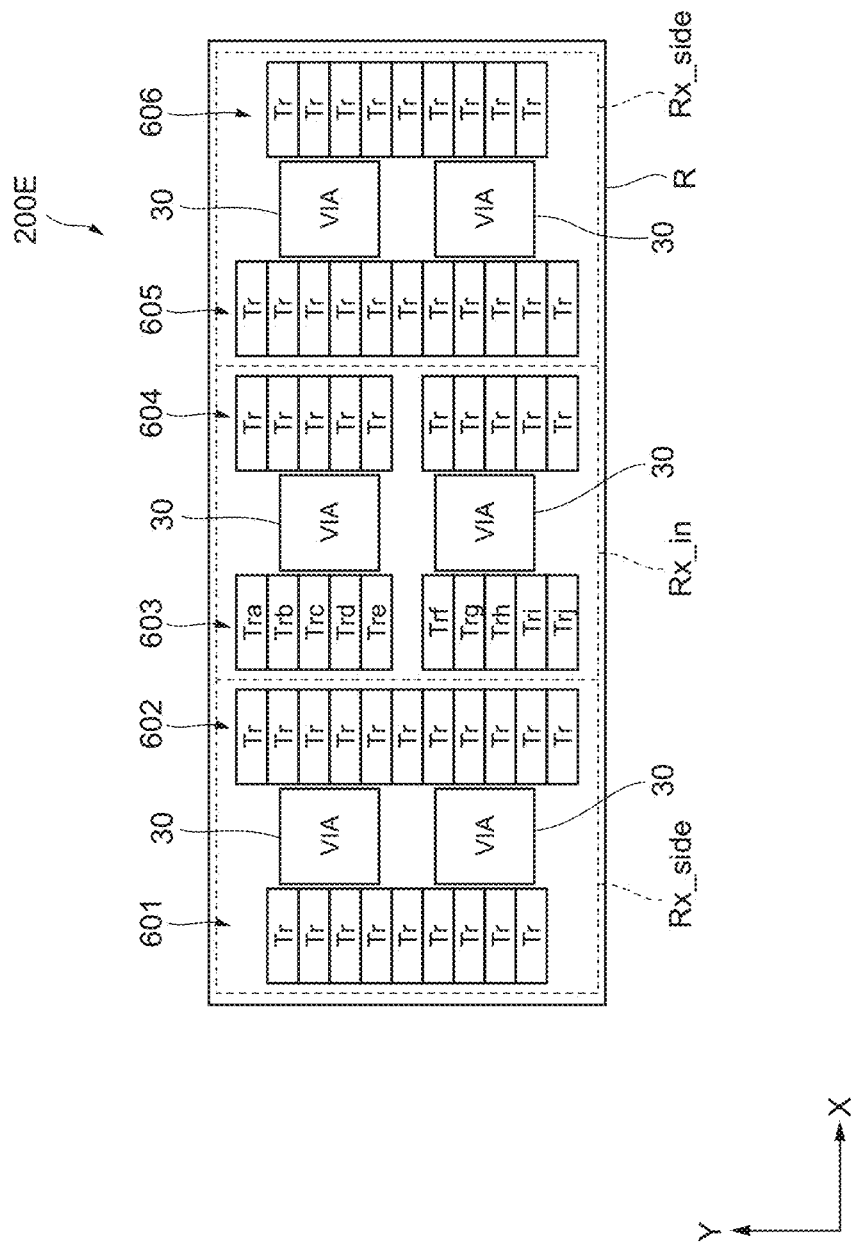
FIG. 18 shows another exemplary arrangement 200E of unit transistors in the amplifier 112.

FIG. 18 shows another exemplary arrangement (exemplary arrangement 200E) of unit transistors in the amplifier 112. Like numbers indicate like components in the exemplary arrangement 200A of FIG. 2 to omit their descriptions.

In comparison with the exemplary arrangement 200A, the configuration of the transistor columns 602 to 605 in the exemplary arrangement 200E in FIG. 18 is the same, but the configuration of the transistor columns 601 and 606 (a group of second transistor columns) located on both ends in the X-axis direction of the region R is different. Specifically, the transistor columns 601 and 606 do not have unit transistors at positions in the X-axis direction opposed to the unit transistors (e.g., unit transistors Tra, Trj) that are located on both ends in the Y-axis direction of a plurality of unit transistors in the transistor columns 603 and 604 (first transistor columns). That is, in the exemplary arrangement 200E, no unit transistors are formed at four corners of the region R.

Figure 19:
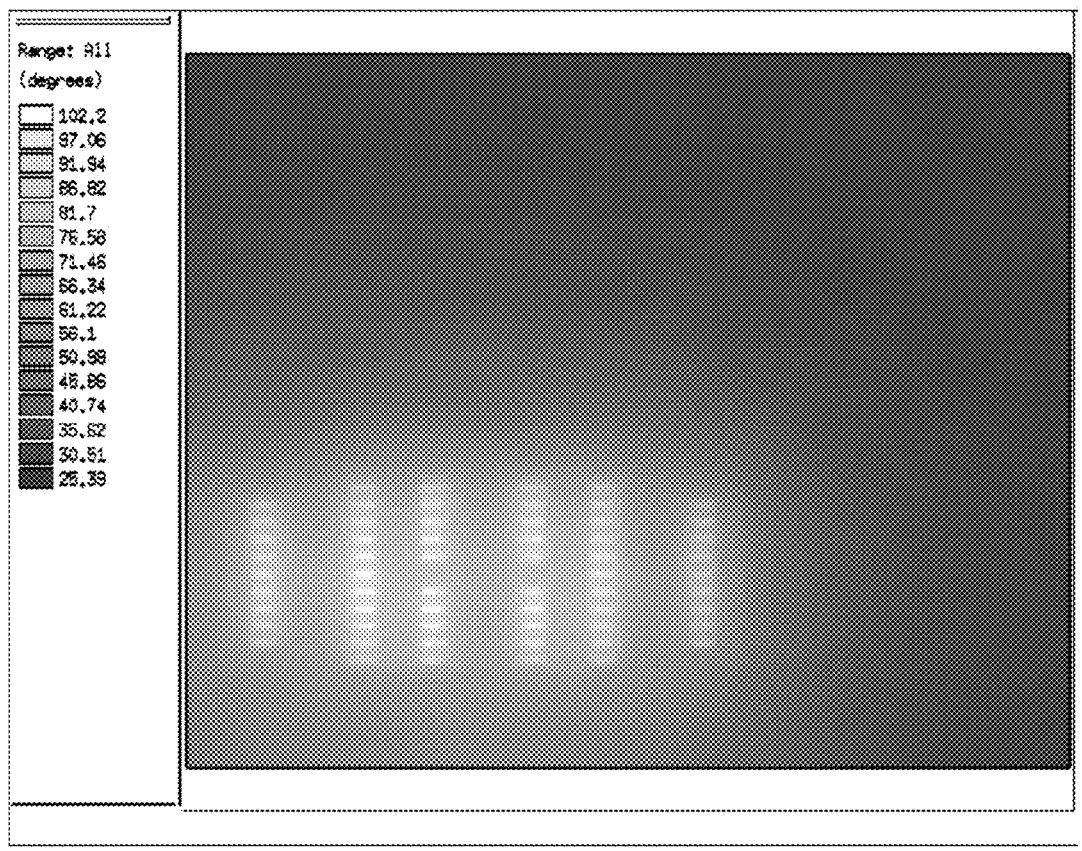
FIG. 19 shows one example simulation result on the temperature distribution of unit transistors in the exemplary arrangement 200E.
Figure 20:
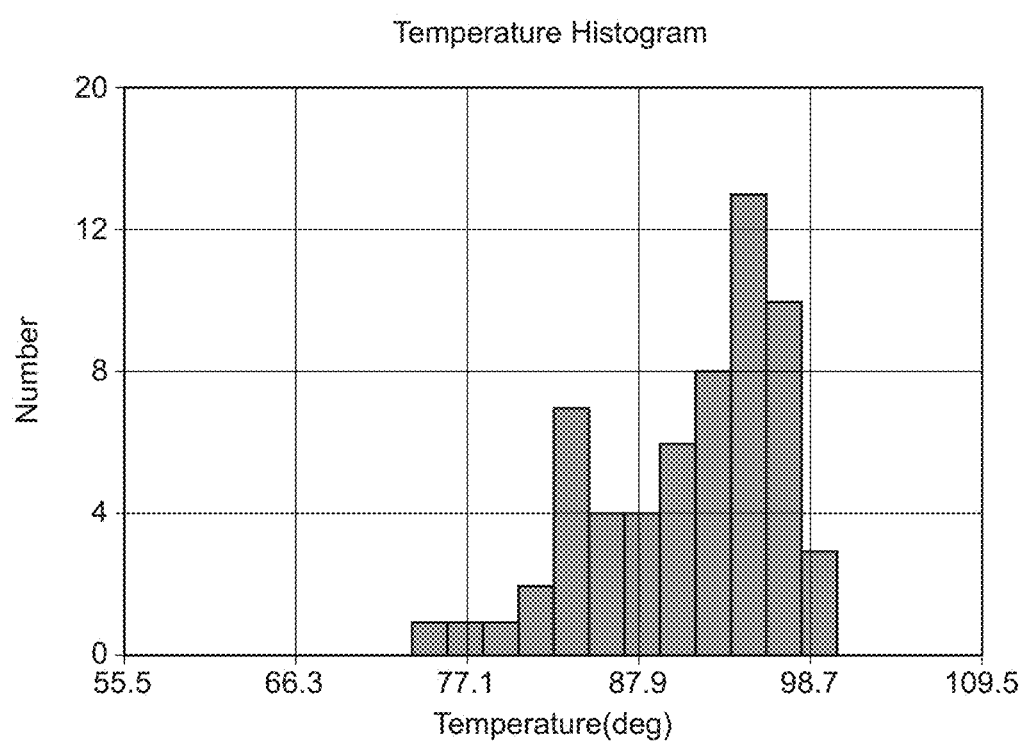
FIG. 20 is a histogram showing one example simulation result on the temperature distribution of the unit transistors in the exemplary arrangement 200E.

FIG. 19 shows one example simulation result on the temperature distribution of unit transistors in the exemplary arrangement 200E. FIG. 20 is a histogram showing one example of simulation result on the temperature distribution of the unit transistors in the exemplary arrangement 200E.

As shown in FIG. 19, temperature is lower at the outer periphery of the region R (especially at four corners) than at a center part. Therefore the configuration not including four unit transistors at four corners means that unit transistors at lower temperatures than at other unit transistors are removed. Accordingly, a temperature variation among the plurality unit transistors can be lowered in the exemplary arrangement 200E compared with the exemplary arrangement 200A.

Figure 21:
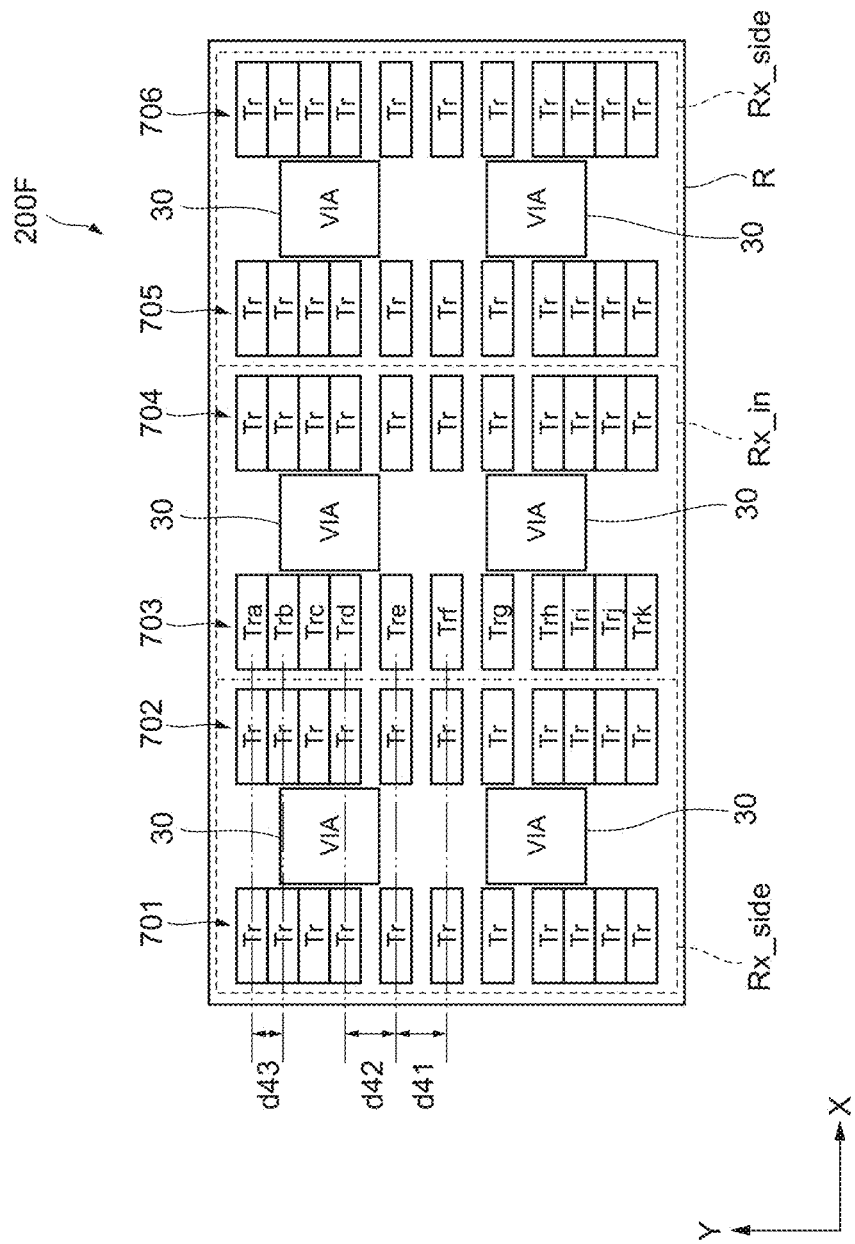
FIG. 21 shows another exemplary arrangement 200F of unit transistors in the amplifier 112.

FIG. 21 shows another exemplary arrangement (exemplary arrangement 200F) of unit transistors in the amplifier 112. Like numbers indicate like components in the exemplary arrangement 200A of FIG. 2 to omit their descriptions.

In comparison with the exemplary arrangement 200A, the exemplary arrangement 200F in FIG. 21 includes unit transistors closer to the center of the transistor columns, and these unit transistors close to the center are arranged having a large distance between them. Specifically, in the transistor column 703, for example, the distance d41 between the adjacent unit transistors Tre and Trf in the Y-axis direction and the distance d42 between the adjacent unit transistors Trd and Tre in the Y-axis direction are larger than the distance d43 between the unit transistors Tra and Trb (d41≈d42>d43). Since the transistor columns 701, 702 and 704 to 706 are similar to the transistor column 703, their descriptions are omitted.

In the exemplary arrangement 200A to 200E, the unit transistors are arranged so that a part of the transistor columns does not to include unit transistors at some parts. In the other embodiments as stated above as well, the transistor columns located at the outside regions Rx_side have a configuration similar to that of the transistor columns located at the inside region Rx_in as in this embodiment.

Figure 22:
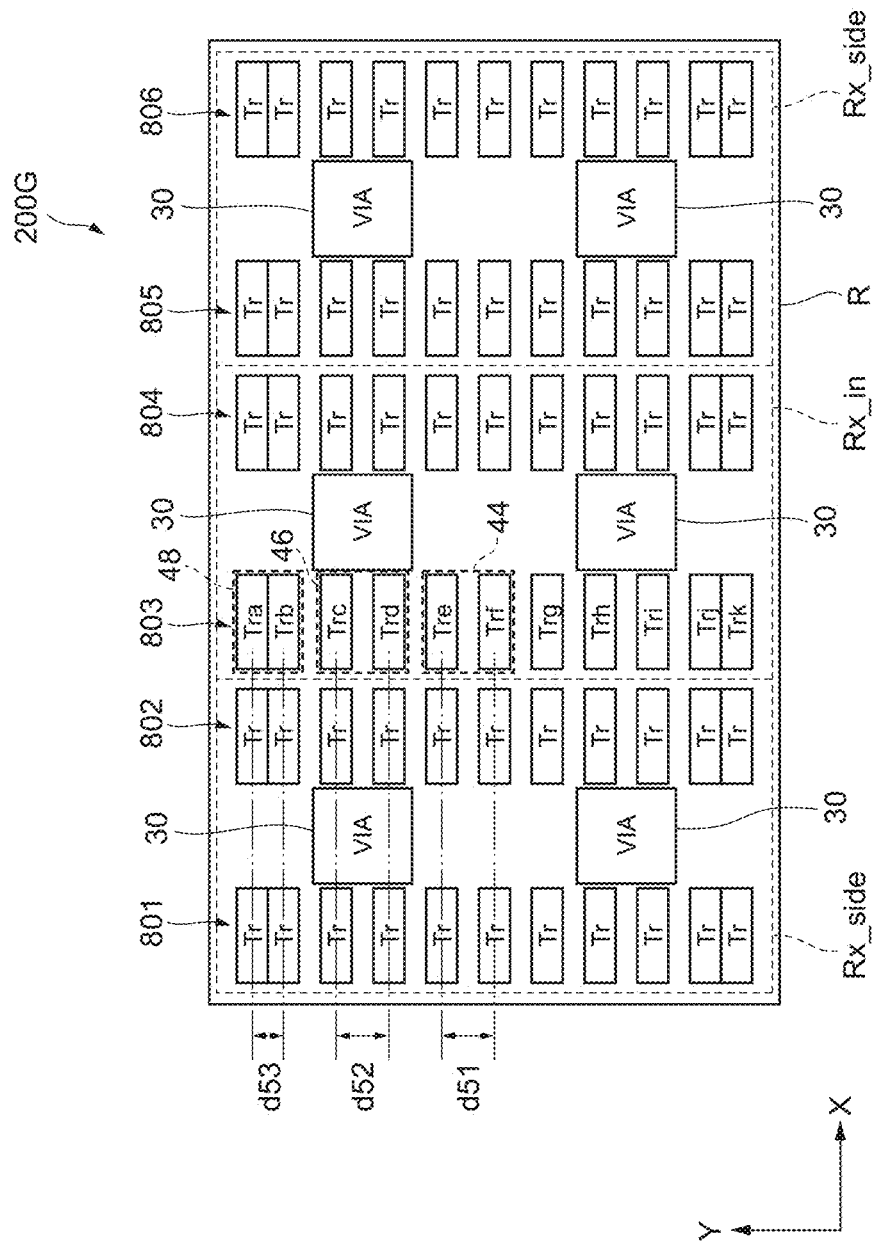
FIG. 22 shows another exemplary arrangement 200G of unit transistors in the amplifier 112.

FIG. 22 shows another exemplary arrangement (exemplary arrangement 200G) of unit transistors in the amplifier 112. Like numbers indicate like components in the exemplary arrangement 200A of FIG. 2 to omit their descriptions.

In comparison with the exemplary arrangement 200F in FIG. 21, unit transistors in the exemplary arrangement 200G in FIG. 22 are arranged so that the distance between unit transistors increases in a stepwise fashion as they are closer to the center in the Y-axis direction. Specifically the transistor column 803, for example, includes a group of unit transistors 44 (first group of unit transistors) made up of unit transistors Tre and Trf formed at a position close to the center O in the Y-axis direction, a group of unit transistors 46 (second group of unit transistors) made up of unit transistors Trc and Trd formed at a position away from the center O compared with the group of unit transistors 44, and a group of unit transistors 48 (third group of unit transistors) made up of unit transistors Tra and Trb formed at a position away from the center O compared with the group of unit transistors 46. Distance d51 denotes the distance between the unit transistors Tre and Trf (first distance), distance d52 denotes the distance between the unit transistors Trc and Trd (second distance), and distance d53 denotes the distance between the unit transistors Tra and Trb (third distance). The distance d51 is larger than the distance d52 and the distance d52 is larger the distance d53 (d51>d52>d53). Since the unit transistor Trg to Trk are X-axis symmetric with the unit transistors Tra to Tre, their descriptions are omitted. Since the transistor columns 801, 802 and 804 to 806 are similar to the transistor column 803, their descriptions are omitted.

In this way, in the exemplary arrangement 200G, the distance between unit transistors increases in a stepwise fashion as they are closer to the center in the Y-axis direction in each of the transistor columns (i.e., as they are closer to a region where temperature of the unit transistors easily increases). Accordingly, a temperature variation among the plurality unit transistors can be lowered compared with the exemplary arrangement 200F.

A difference in distance changed in a stepwise fashion shown in the exemplary arrangement 200G may be used in combination with the configurations of the exemplary arrangement 200A to 200F as stated above. For instance, the exemplary arrangement 200G and the exemplary arrangement 200A may be combined, so that, in the transistor columns 801, 802, 805 and 806 at the outside region Rx_side of the exemplary arrangement 200G, unit transistors may be formed having a distance (fourth distance) smaller than the distance d51. Alternatively, the exemplary arrangement 200G and the exemplary arrangement 200E may be combined, so that the exemplary arrangement 200G does not include unit transistors at four corners of the region R.

In the exemplary arrangements 200A to 200G of unit transistors, the distance between unit transistors closer to the center in the Y-axis direction in the transistor columns is larger than the distance between unit transistors away from the center. This configuration can suppress a temperature rise of the unit transistors at a center part where temperature is higher than at the outer periphery part. Accordingly, a temperature variation among the plurality unit transistors can be lowered.

In the exemplary arrangement 200G, the distance between the unit transistors increases as they are closer to the center in the Y-axis direction in the transistor columns 803 and 804. That is, in the exemplary arrangement 200G, the distance between unit transistors increases in a stepwise fashion as they are closer to a region where temperature of the unit transistors easily increases. Accordingly, a temperature variation among the plurality unit transistors can be lowered in the exemplary arrangement 200G compared with the exemplary arrangement 200F.

The exemplary arrangement 200A to 200E includes a group of transistor columns disposed on both sides of the transistor columns formed at the inside region, and this group of transistor columns includes a plurality of unit transistors that are disposed with a distance between them narrower than the distance between unit transistors closer to the center in the transistor columns formed at the inside region. With this configuration, unit transistors are formed relatively densely at the outside region where temperature tends to be lower than at the inside region, and therefore a temperature variation among the unit transistors can be suppressed.

The exemplary arrangement 200E does not include unit transistors at four corners of the region R to form a group of transistors. With this configuration, unit transistors at lower temperatures than at other unit transistors are removed. Accordingly, a temperature variation among the plurality unit transistors can be lowered in the exemplary arrangement 200E compared with the exemplary arrangement 200A.

The embodiments described above are intended to facilitate the understanding of the present disclosure and are not intended to limit the present disclosure. The present disclosure can be changed and modified without departing from the spirit thereof, and the present disclosure includes equivalents thereof. That is, design modifications to the above embodiments, which will be made by a person skilled in the art as appropriate, are also included in the scope of the present disclosure. For instance, each element in the above embodiments and the arrangement, materials, conditions, shapes, dimensions, etc., thereof are not limited to those described above and may be modified as appropriate. Each element in these embodiments can be combined, and such a combination also is included in the scope of the present disclosure.

REFERENCE SIGNS LIST

20 . . . semiconductor substrate
30, 32 . . . via hole
40, 42, 44, 46, 48 . . . a group of unit transistors
100 . . . power amplifier circuit
110, 111, 112 . . . amplifier
120, 121, 122 . . . capacitor
200A to 200G . . . exemplary arrangement
201 to 206, 301 to 306, 401 to 406, 501 to 506, 601 to 606, 701 to 706, 801 to 806 . . . transistor column
Tra to Trk . . . unit transistor

What is claimed is:

1. A semiconductor device, comprising:
a semiconductor substrate; and
a transistor group including a plurality of columns, each column having a plurality of unit transistors that are aligned and arranged along a Y-axis on the semiconductor substrate,
wherein the plurality of columns include a first column having:
a plurality of rows, each row including a single unit transistor;
a first group of transistors including two of the unit transistors that are adjacent to each other along the Y-axis with a first distance therebetween,
a second group of transistors including two of the unit transistors that are adjacent to each other along the Y-axis with a second distance therebetween, and
a third group of transistors including two of the unit transistors that are adjacent to each other along the Y-axis with a third distance therebetween,
wherein:
the first group of transistors is disposed at a position closer to a center of the first transistor column along the Y-axis than the second group of transistors,
the first distance is larger than the second distance,
the second group of transistors is disposed at a position closer to the center of the first transistor column along the Y-axis than the third group of transistors, and
the second distance is larger than the third distance.

2. The semiconductor device according to claim 1, wherein the plurality of columns includes:
a group of second columns disposed on opposing sides of the first column along an X-axis orthogonal to the Y-axis on the semiconductor substrate,
wherein the plurality of unit transistors in the group of second columns are adjacent to each other along the Y-axis with a fourth distance therebetween, and
wherein the fourth distance is smaller than the first distance.

3. The semiconductor device according to claim 2, wherein
the group of second columns is located on both ends of the transistor group along the X-axis, and
the group of second columns does not include unit transistors at positions along the X-axis opposed to unit transistors located on both ends of the first column along the Y-axis.

4. The semiconductor device according to claim 2, wherein via holes are formed between the first column and the group of second columns along the Y-axis.

5. The semiconductor device according to claim 1, wherein
the plurality of columns further includes a group of second columns disposed on opposing sides of the first column along an X-axis orthogonal to the Y-axis on the semiconductor substrate, the plurality of unit transistors in the group of second columns are adjacent to each other along the Y-axis with a fourth distance therebetween, and the fourth distance is smaller than the first distance.

6. The semiconductor device according to claim 5, wherein the group of second columns is located on both ends of the transistor group along the X-axis, and the group of second columns does not include unit transistors at positions along the X-axis opposed to unit transistors located on both ends of the first column along the Y-axis.

* * * * *